(12) United States Patent
Wen et al.

(10) Patent No.: US 10,520,533 B2
(45) Date of Patent: Dec. 31, 2019

(54) CAPACITANCE SENSING CIRCUIT

(71) Applicant: SHENZHEN GOODIX TECHNOLOGY CO., LTD., Shenzhen, Guangdong (CN)

(72) Inventors: Yanan Wen, Shenzhen (CN); Yingsi Liang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 298 days.

(21) Appl. No.: 15/657,588

(22) Filed: Jul. 24, 2017

(65) Prior Publication Data

US 2017/0322245 A1 Nov. 9, 2017

Related U.S. Application Data

(63) Continuation of application No. PCT/CN2016/090471, filed on Jul. 19, 2016.

(30) Foreign Application Priority Data

Dec. 31, 2015 (CN) .......................... 2015 1 1027756

(51) Int. Cl.
  *G01R 27/26* (2006.01)
  *G06F 3/041* (2006.01)
  *G06F 3/044* (2006.01)

(52) U.S. Cl.
  CPC ......... *G01R 27/2605* (2013.01); *G06F 3/044* (2013.01); *G06F 3/0412* (2013.01);
  (Continued)

(58) Field of Classification Search
  CPC .... G01R 27/2605; H03K 2217/960725; G06F 3/0418; G06F 3/041; G06F 3/044
  See application file for complete search history.

(56) References Cited

U.S. PATENT DOCUMENTS 8,564,565 B2* 10/2013 Westhues .............. G06F 3/0412
  345/173
2012/0223911 A1 9/2012 Westhues
  (Continued)

FOREIGN PATENT DOCUMENTS

CN   1485736 A    3/2004
CN   103415827 A  11/2013
  (Continued)

OTHER PUBLICATIONS

Extended European Search Report for European Patent Application No. 16880556 dated Feb. 27, 2018.

*Primary Examiner* — Amy He
(74) *Attorney, Agent, or Firm* — Heslin Rothenberg Farley & Mesiti P.C.

(57) ABSTRACT

As applied to the field of touch control technology, a capacitance sensing circuit for sensing a detection capacitor of a detecting circuit, includes: a capacitance judging circuit coupled to the detecting circuit for judging the capacitance of the detection capacitor according to the output signal; and an input signal generator coupled to the detecting circuit for generating the input signal according to noise. The input signal generator includes: a phase detection unit for receiving the noise and detecting a first phase of the noise; a phase calculation unit coupled to the phase detection unit for receiving the noise and the first phase and calculating an optimum phase according to the noise and the first phase; and a first waveform generator coupled to the phase calculation unit for generating the input signal according to the optimum phase.

19 Claims, 11 Drawing Sheets

(52) U.S. Cl.
CPC ............... *G06F 3/0418* (2013.01); *H03K 2217/960725* (2013.01)

(56) References Cited

U.S. PATENT DOCUMENTS

| | | |
|---|---|---|
| 2013/0293511 A1 | 11/2013 | Nam |
| 2014/0267086 A1 | 9/2014 | Yousefpor et al. |
| 2015/0123950 A1* | 5/2015 | Ding .................... G06F 3/0418 345/178 |

FOREIGN PATENT DOCUMENTS

| | | |
|---|---|---|
| JP | 3062206 B2 | 7/2000 |
| JP | 2004193938 A | 7/2004 |
| JP | 2005210297 A | 8/2005 |
| KR | 20140010949 A | 1/2014 |

* cited by examiner

CAPACITANCE SENSING CIRCUIT

CROSS-REFERENCE TO RELATED APPLICATIONS

The present application is a continuation of international application No. PCT/CN2016/090471 filed on Jul. 19, 2016, which claims the priority to Chinese Patent Application No. 201511027756.6, filed on Dec. 31, 2015, both of which are hereby incorporated by reference in their entireties.

TECHNICAL FIELD

The present application relates to the field of touch technology, and more particularly to a capacitance sensing circuit which generates an input signal according to phase of a noise.

BACKGROUND

Recently, with the increasing progress of science and technology, humanization is gradually realized in operation interface of a variety of electronic products. For example, through a touch panel, a user can directly operate on a screen, input information, texts and designs by a finger or stylus, without the trouble of using an input device such as keyboard or keys. Actually, the touch panel is usually composed of a sensing panel and a display disposed behind the sensing panel. An electronic device judges the meaning of the touch based on the position touched by the user on the sensing panel and the screen presented by the display at the time, and executes a corresponding operation result.

Capacitive touch technology judges a touch event by sensing the change of capacitance of a detection capacitor in a detecting circuit. The existing capacitive touch technology can be divided into a self-capacitance technology and a mutual-capacitance technology. A capacitance sensing circuit in a self-capacitance touch panel or a mutual-capacitance touch panel can apply a periodic input signal to the detecting circuit and receive an output signal from the detecting circuit, calculate the change amount of the detection capacitor in the detecting circuit by analyzing a phase or amplitude of the output signal, so as to judge the occurrence of a touch event and the actual coordinate position.

However, since the input signal has a specific frequency, when the capacitance sensing circuit of the touch panel is very close to a liquid crystal display module, a charging module, or other devices, it is susceptible to electromagnetic interference of specific frequencies from the surrounding liquid crystal display module, the charging module or other devices. In the related art, an input signal of the capacitance sensing circuit does not undergo any process to be synchronized with signals of the liquid crystal display module, the charging module or other devices, such that external electromagnetic interference brings a negative impact on the capacitance sensing circuit judging the touch event. Therefore, there is a need for improvement in the related art.

SUMMARY

One technical problem to be solved by an embodiment of the present disclosure is to provide a capacitance sensing circuit which can generate an input signal according to phase of a noise to overcome the drawbacks of the related art.

An embodiment of the present disclosure is implemented by a capacitance sensing circuit for sensing a detection capacitor (capacitor to be measured) of a detecting circuit, the detecting circuit receives an input signal and generating an output signal, the capacitance sensing circuit includes:

a capacitance judging circuit coupled to the detecting circuit and configured for judging the capacitance of the detection capacitor according to the output signal; and an input signal generator coupled to the detecting circuit and configured for generating the input signal according to noise, the input signal generator includes:

a phase detection unit for receiving the noise and detecting a first phase of the noise;

a phase calculation unit coupled to the phase detection unit and configured for receiving the noise and the first phase and calculating an optimum phase according to the noise and the first phase; and a first waveform generator coupled to the phase calculation unit for generating the input signal according to the optimum phase.

A capacitance sensing circuit of an embodiment of the present disclosure generates an input signal related to phase of a noise by using an input signal generator, to reduce the energy associated with the noise in the mixed output signal of the capacitance judging circuit, i.e. to reduce the influence of noise on judging the detection capacitor, so as to enhance the overall performance of the capacitance sensing circuit.

DETAILED DESCRIPTION

In order that the objects, technical aspects and advantages of the present disclosure will become more apparent, some embodiments of the present disclosure will be described in further detail below with reference to the accompanying drawings and examples. It is to be understood that the specific embodiments described herein are for the purpose of explaining the disclosure and are not used to be limit the disclosure.

Figure 1:
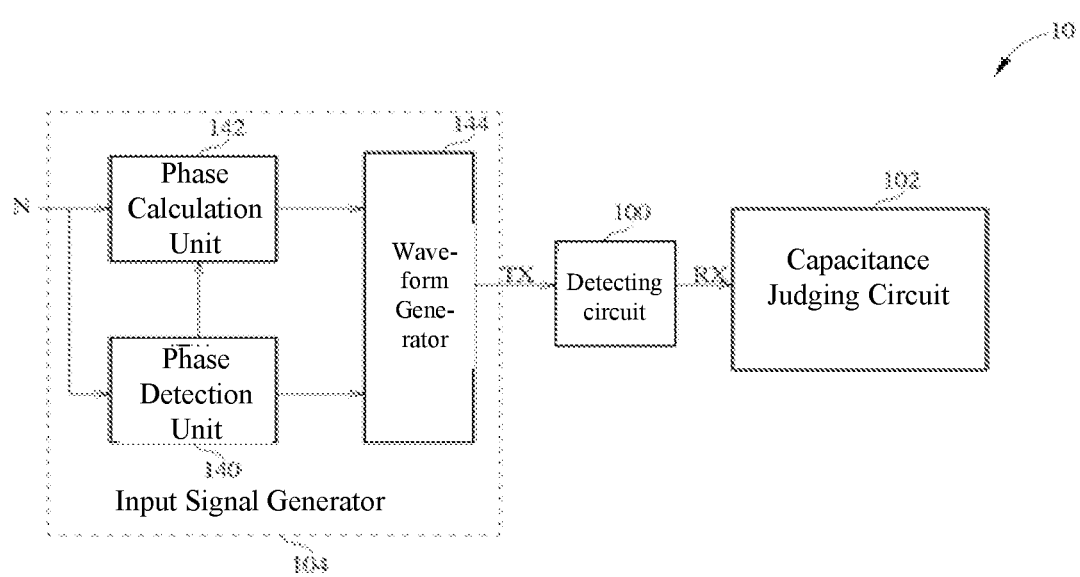
FIG. 1 is a schematic diagram of a capacitance sensing circuit according to an embodiment of the present disclosure.

Please refer to FIG. 1 which is a schematic diagram of a capacitance sensing circuit 10 according to an embodiment of the present disclosure. The capacitance sensing circuit 10 includes a detecting circuit 100, a capacitance judging circuit 102, and an input signal generator 104. The detecting circuit 100 is coupled to the input signal generator 104, and the capacitance judging circuit 102 is coupled to the detecting circuit 100.

The capacitance sensing circuit 10 inputs an input signal TX to the detecting circuit 100, the capacitance judging circuit 102 receives an output signal RX from the detecting circuit 100 and calculates the change amount of a detection capacitor CUT in the detecting circuit 100 by analyzing a phase or amplitude of an output signal RX. The input signal generator 104, which includes a phase detection unit 140, a phase calculation unit 142 and a waveform generator 144, receives a noise N and generates an input signal TX according to the noise N. The phase detection unit 140 is configured to receive the noise N and detect a first phase $\phi_1$ and a first frequency fl of the noise N. The phase calculation unit 142 is coupled to the phase detection unit 140 and is configured to calculate an optimum phase $\phi_2^{opt}$ according to the first phase $\phi_1$ and the first frequency fl detected by the phase detection unit 140, and transmit the optimum phase $\phi_2^{opt}$ to the waveform generator 144. The waveform generator 144 is coupled to the phase detection unit 140 and the phase calculation unit 142 and is configured to generate an input signal TX according to the first phase $\phi_1$ and the optimum phase $\phi_2^{opt}$.

Figure 10:
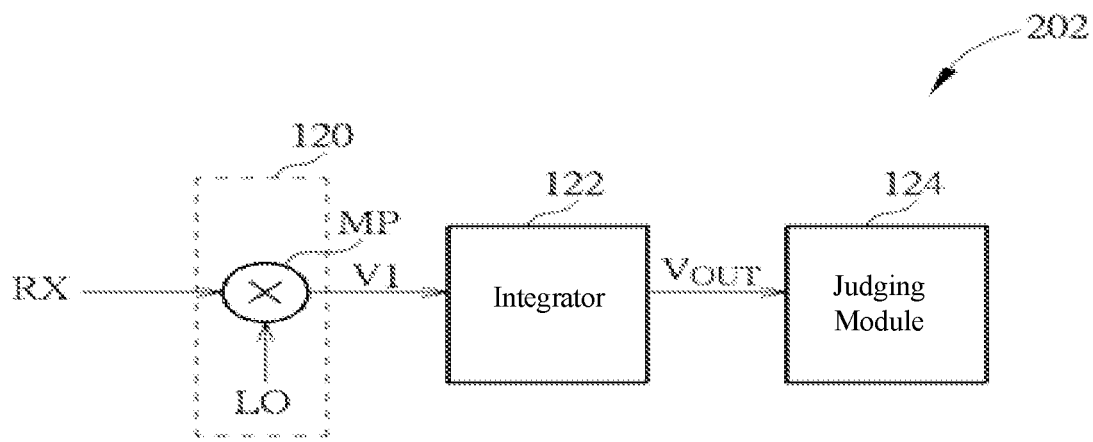
FIG. 10 is a schematic diagram of a capacitance judging circuit according to an embodiment of the present disclosure.

The capacitance judging circuit 102 is briefly described as follows. As shown in FIG. 10, FIG. 10 is a schematic diagram of a capacitance judging circuit 202. The capacitance judging circuit 102 may be implemented by the capacitance judging circuit 202. The capacitance judging circuit 202 includes a mixer 120, an integrator 122 and a judging module 124. The mixer 120 may include a multiplier MP and is configured to mix the output signal RX with a local signal LO and generate an output signal V1, wherein the local signal LO is associated with the input signal TX. In an embodiment, the local signal LO is the input signal TX. The integrator 122 integrates the output signal V1 (that is, the high frequency portion of the mixed output signal is eliminated), and the judging module 124 judges the change amount of the capacitance to be measured CUT in the detecting circuit 100 according to the mixed output signal VOUT of the integrator 122.

In order to reduce the influence of the noise N on judging the detection capacitor CUT, it is preferable that the phase calculation unit 142 may calculate the optimum phase $\phi_2^{opt}$ by an optimization algorithm, $$\phi_2^{opt} = \underset{\phi_2}{\operatorname{argmin}}\left(\int n(t;\phi_1)x(t;\phi_2)dt\right)^2 \quad \text{(Equation 1)}$$

wherein, $n(t;\phi_1)$ represents a waveform function of the noise N that varies with time when the phase of the noise N is the first phase $\phi_1$, and $x(t;\phi_2)$ represents a waveform function of the input signal TX when the phase of the input signal TX is the second phase $\phi_2$. In other words, in the case that the phase of the noise N received by the phase calculation unit 142 from the phase detection unit 140 is the first phase $\phi_1$, when the optimum phase $\phi_2^{opt}$ is the calculation result calculated according to Equation 1, the input signal TX generated by the waveform generator 144 according to the optimum phase $\phi_2^{opt}$ may minimize the energy associated with the noise in the mixed output signal VOUT, i.e. reduce the influence of noise N on judging the detection capacitor CUT to the minimum, so as to enhance the performance of the capacitance sensing circuit 10.

Figure 2:
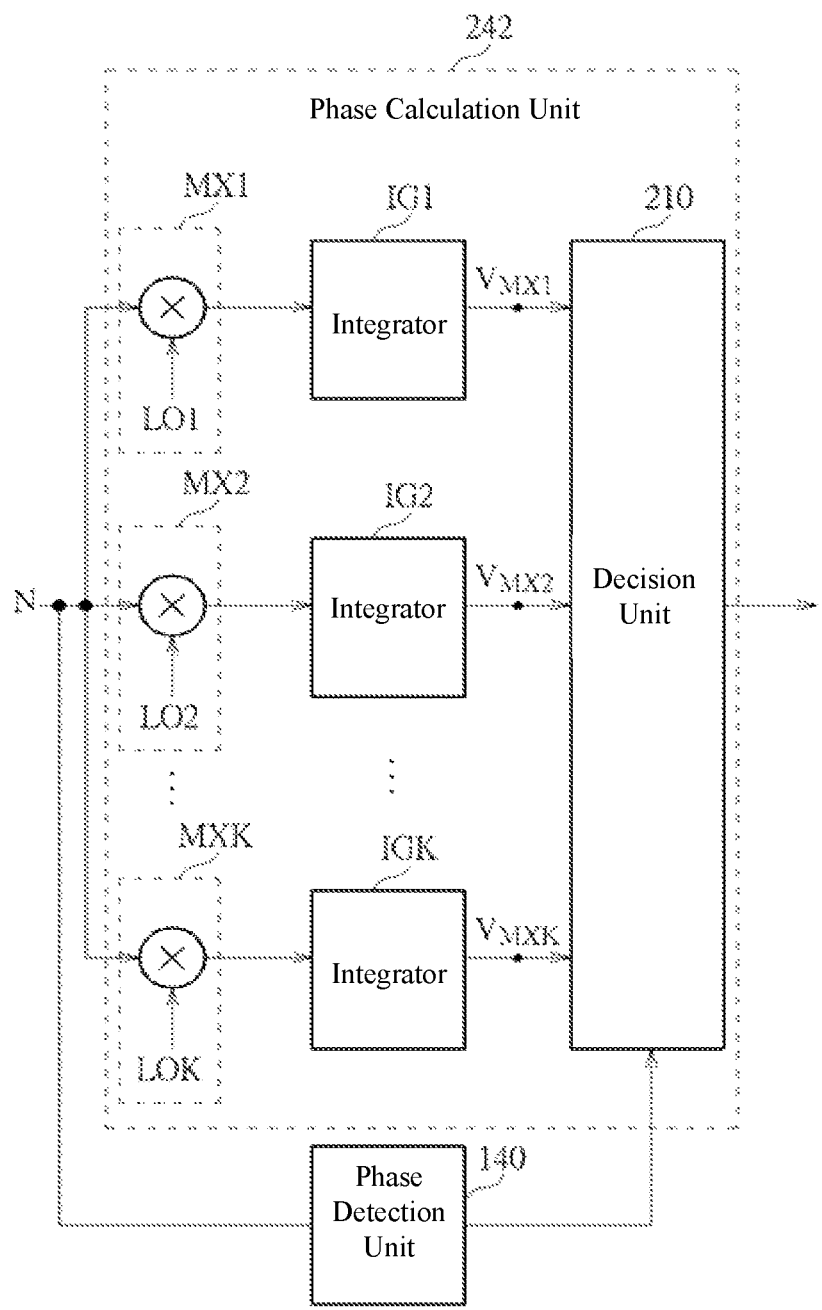
FIG. 2 is a schematic diagram of a phase calculation unit according to an embodiment of the present disclosure.

On the other hand, the phase calculation unit may mix the noise N with a plurality of local signals having different phases, generate a plurality of mixed output signals, and select a first local signal the mixed output signal having the minimum energy, and the first local phase corresponding to the first local signal is the optimum phase. Specifically, please refer to FIG. 2 which is a schematic diagram of a phase calculation unit 242 according to an embodiment of the present disclosure. The phase calculation unit 242 includes mixers MX1 to MXK, integrators IG1 to IGK and a decision unit 210. The mixers MX1 to MXK respectively mix the noise N with local signals LO_1 to LO_K each having K different phases. For example, in an embodiment, the phase of the local signal LO_1 is 0, the phase of the local signal LO_2 is π/K, the phase of the local signal LO_3 is 2π/K, and so on, the phase of the local signal LO_K is (K−1)π/K. After the mixers MX1 to MXK mix the noise N, the integrators IG1 to IGK respectively integrate the output signals of the mixers MX1 to MXK to generate mixed output signals VMX1 to VMXK. The decision unit 210 selects the mixed output signal VMXS having the minimum energy from the mixed output signals VMX1 to VMXK, and the local signal corresponding to the mixed output signal VMXS is the local signal LO_S and the phase of the local signal LO_S is (S−1)π/K. Therefore, the phase calculation unit 242 can output the optimum phase $\phi_2^{opt}$ as (S−1)π/K. Wherein, the number K of the mixers MX1 to MXK (or integrators IG1 to IGK) is associated with the resolution of the phase calculation unit 242, that is, the larger the number K is, the closer the optimum phase obtained by the phase calculation unit 242 (ie., (S−1) π K) gets to the optimum phase calculated according to Equation 1.

Figure 3:
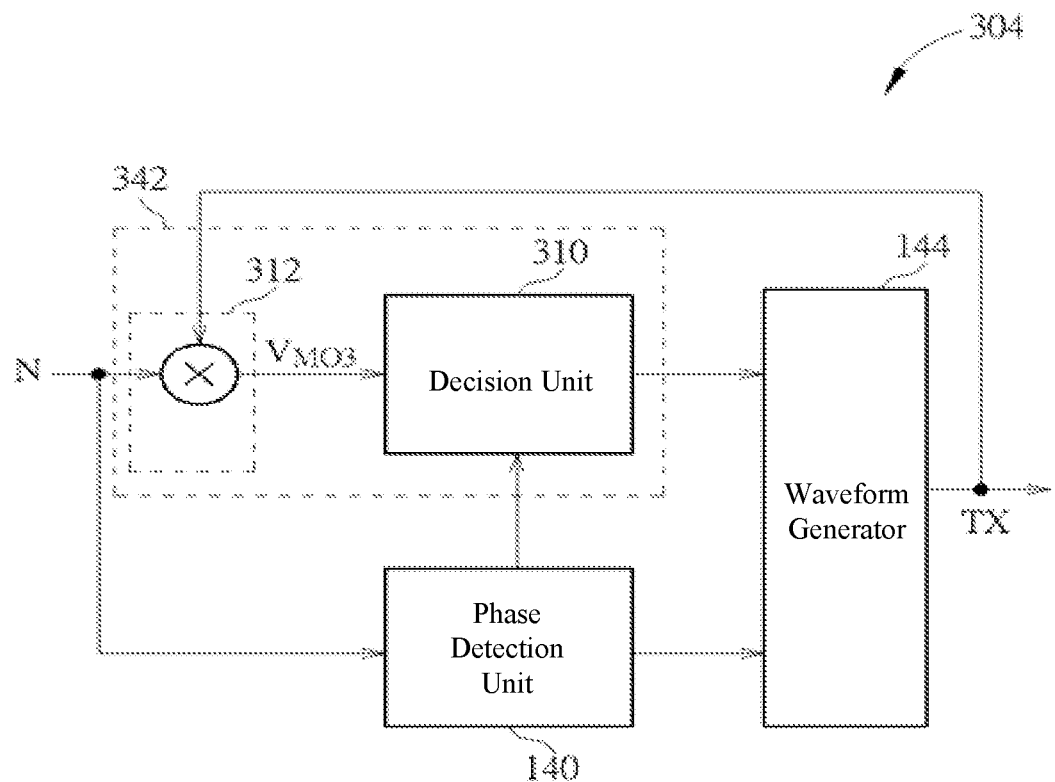
FIG. 3 is a schematic diagram of an input signal generator according to an embodiment of the present disclosure.

In addition, the phase calculation unit can also calculate the optimum phase by using an Iterative feedback approach. Please refer to FIG. 3 which is a schematic diagram of an input signal generator 304 according to an embodiment of the present disclosure. The input signal generator 304 is similar to the input signal generator 104, so the same components adopt the same reference numerals. In contrast to the input signal generator 104, the input signal generator 304 includes a phase calculation unit 342 that includes a mixer 312 and a decision unit 310.

The operation principle of the input signal generator 304 is described below. Assuming that the decision unit 310 initially outputs the optimum phase $\phi_{2,0}^{opt}$ after the waveform generator 144 generates the input signal TX according to the optimum phase $\phi_{2,0}^{opt}$ output by the decision unit 310, the input signal TX is fed back to the mixer 312 (representing that the waveform generator 144 is coupled to the mixer 312), the mixer 312 mixes the noise N with the input signal TX generated according to the optimum phase $\phi_{2,0}^{opt}$, and the decision unit 310 can compute another optimum phase $\phi_{2,1}^{opt}$ according to the mix output signal VMO3 from the mixer 312, then the waveform generator 144 generates the input signal TX according to the optimum phase $\phi_{2,1}^{opt}$, and then the mixer 312 mixes the input signal TX generated from the optimum phase $\phi_{2,1}^{opt}$ with the noise N, such that the decision unit 310 can compute another optimum phase $\phi_{2,2}^{opt}$. The iteration is performed until the difference between the optimum phase $\phi_{2,m}^{opt}$ calculated by the current iteration and the optimal phase $\phi_{2,m-1}^{opt}$ calculated by the previous iteration is less than a certain range, or the number of iterations is greater than a certain value. Thus, even the phase of the noise N is changed due to a particular factor at different time, the input signal generator 304 can still continuously track the phase of the noise N and accordingly generate the input signal TX to reduce the influence of the noise N on judging the detection capacitor CUT, so as to enhance the overall performance of the capacitance sensing circuit.

Figure 4:
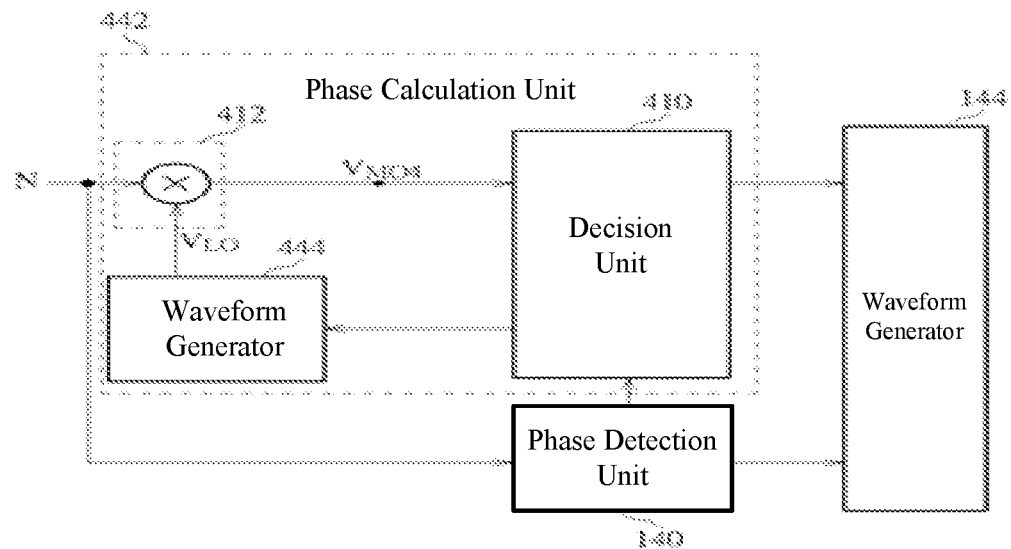
FIG. 4 is a schematic illustration of another phase calculation unit according to an embodiment of the present disclosure.
Figure 5:
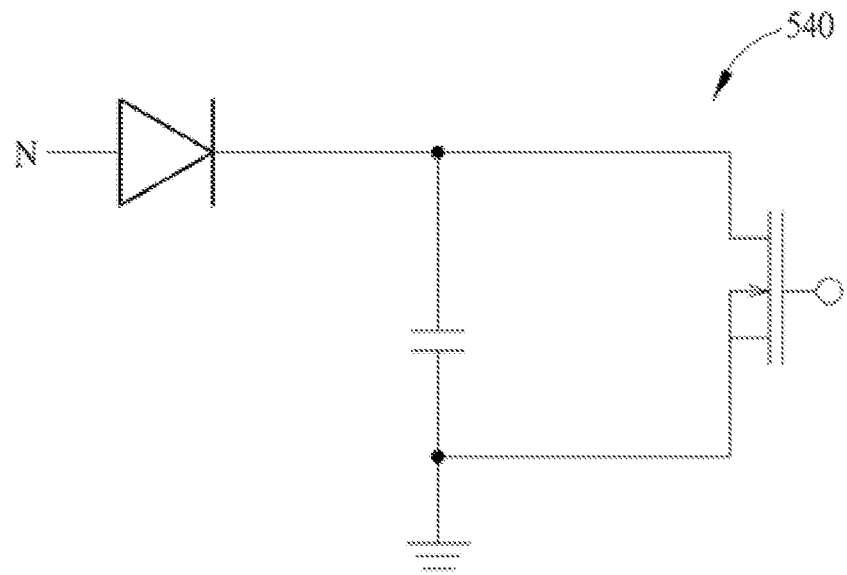
FIGS. 5 to 9 are schematic diagrams of a phase detection unit according to embodiments of the present disclosure.
Figure 6:
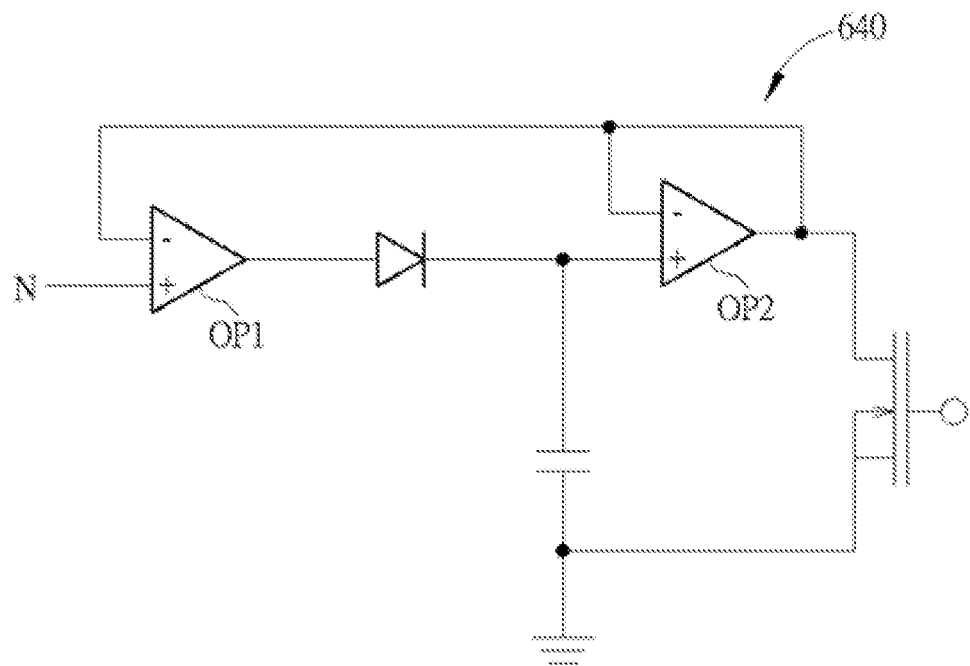
Figure 7:
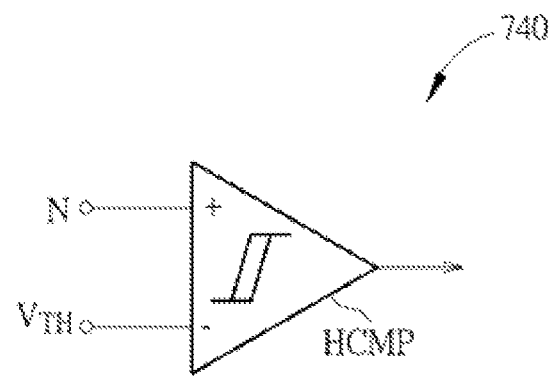
Figure 8:
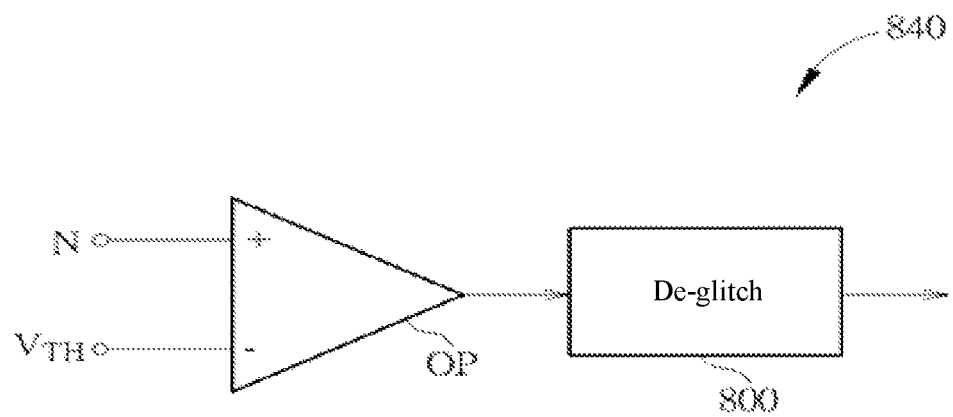
Figure 9:
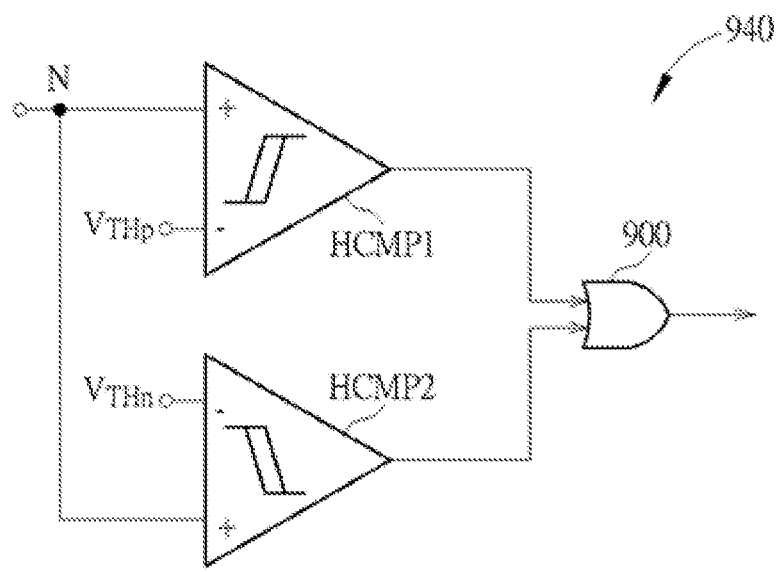

In addition, the phase calculation unit may further include a waveform generator for calculating the optimum phase in an iterative feedback approach. Please refer to FIG. 4, which is a schematic illustration of a phase calculation unit 442 according to an embodiment of the present disclosure. The phase calculation unit 442 includes a mixer 412, a decision unit 410, and a waveform generator 444. Similar to the input signal generator 304, the decision unit 410 initially generates the phase k°, and the waveform generator 444 generates the local signal VLO to the mixer 412 according to the phase $\phi_{2,0}$, the mixer 412 mixes the noise N with the local signal VLO and generates the output signal VMO4, the decision unit 410 generates another phase $\phi_{2,1}$ according to the output signal VMO4. The iteration is performed until the difference between the optimum phase $\phi_{2,m}$ calculated by the current iteration and the optimal phase $\phi_{2,m-1}$ calculated by the previous iteration is less than a certain range, or the number of iterations is greater than a certain value. When the iteration is completed, the final phase $\phi_{2,M}$ output by the decision unit 410 is the optimum phase $\phi_2^{opt}$. Unlike the input signal generator 304, the phase calculation unit 442 includes a waveform generator 444 to perform an iterative feedback operation. In other words, the feedback source of the mixer 412 is the waveform generator 444; but in the input signal generator 304, the feedback source of the mixer 312 is the waveform generator 144. Similarly, even the phase of the noise N is changed due to a particular factor at different time, the phase calculation unit 442 can still continuously track the phase of the noise N and accordingly generate the input signal TX to reduce the influence of the noise N on judging the detection capacitor CUT, so as to enhance the overall performance of the capacitance sensing circuit.

From the above, it can be seen that the capacitance sensing circuit 10 uses the input signal generator 104 to generate an input signal TX related to the phase of the noise N to reduce the energy associated with the noise in the mixed output signal VOUT in the capacitance judging circuit 102. Compared with the related art, the disclosure can further reduce the influence of the noise N on judging the detection capacitor CUT, so as to enhance the overall performance of the capacitance sensing circuit It is to be noted that the implementation of the phase detection unit is not limited thereto, for example, FIGS. 5 to 9 may be referred to. FIGS. 5 to 9 are schematic diagrams of a phase detection units 540 to 940 according to embodiments of the present disclosure.

The phase detection unit 540 includes a diode, a capacitor, and a transistor. The diode is used for receiving the noise N, the capacitor has a first terminal coupled to the diode and a second terminal coupled to ground, the transistor is coupled between the first terminal and the second terminal of the capacitor.

The phase detection unit 640 is similar to the phase detection unit 540 except that the phase detection unit 640 further includes operational amplifiers OP1, OP2. The negative inputs (labeled "−") of the operational amplifiers OP1, OP2 are both coupled to the output of the operational amplifier OP2, the positive input of the operational amplifier OP2 (labeled "+") is coupled between the diode and the capacitor, the positive input of the operational amplifier OP1 (labeled "+") is used for receiving the noise N, and the transistor is coupled between the output of the operational amplifier OP2 and the second terminal of the capacitor.

The phase detection unit 740 includes a hysteresis comparator HCMP which is a comparator with hysteresis protection, such as a Schmitt Trigger. The negative input of the Hysteresis Comparator HCMP (labeled "−") is used for receiving a threshold voltage VTH, and the positive input (labeled "+") is used for receiving the noise N.

The phase detection unit 840 is similar to the phase detection unit 740 except that the phase detection unit 840 replaces a function of the hysteresis comparator HCMP in the phase detection unit 740 with an operational amplifier OP and a de-glitch unit 800.

The phase detection unit 940 includes hysteresis comparators HCMP1 and HCMP2. The positive inputs of the hysteresis comparators HCMP1 and HCMP2 (labeled "+") are used for receiving the noise N, and the negative inputs of the hysteresis comparators HCMP1 and HCMP2 (labeled "−") are used for receiving threshold voltages VTHp, VTHn, respectively. The outputs of the hysteresis comparators HCMP1, HCMP2 are coupled to an Or Gate 900.

In short, all of the phase detection units 540-940 can detect the first phase $\phi_1$ and the first frequency fl of the noise N and provide them to the waveform generator, therefore, the input signal generator according to the present disclosure can generate the input signal TX according to the phase of the noise N.

It is to be noted that the foregoing embodiments are intended to illustrate the concept of the disclosure and those skilled in the art will be able to make various modifications without limiting thereto. For example, there is no limit to the manner in which the waveform generator 144 generates the input signal TX according to the optimum phase, and the waveform generator 144 may directly generate an input signal TX according to a parent signal, wherein the phase difference between the input signal TX and the parent signal is the optimum phase $\phi_2^{opt}$; or the waveform generator may convert the optimum phase $\phi_2^{opt}$ into a delay time $\Delta t^{opt}$, and generate an input signal TX, wherein the time difference between the input signal TX and the parent signal is the delay time $\Delta t^{opt}$. These are also within the scope of the present disclosure.

Figure 11:
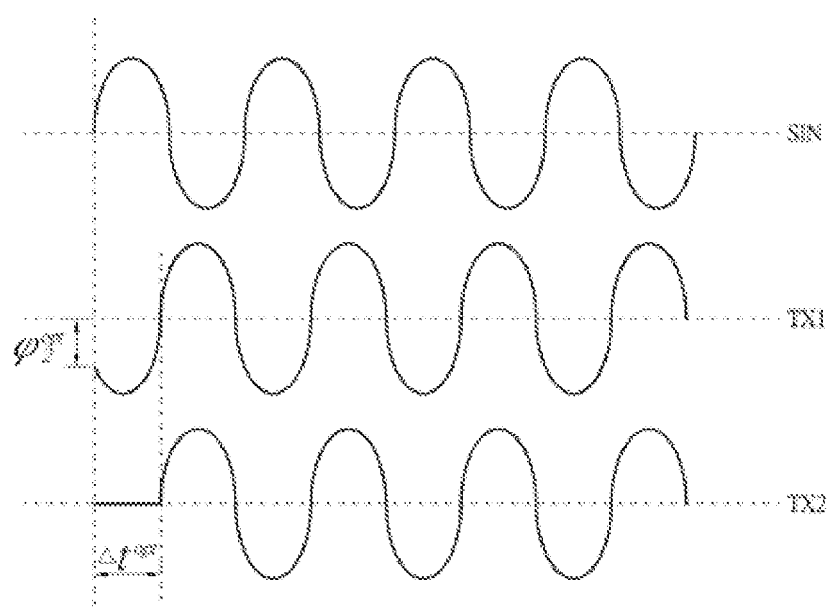
FIG. 11 is a waveform diagram of a plurality of signals according to an embodiment of the present disclosure.

Specifically, please refer to FIG. 11, which is the waveforms of the parent signal SIN and the input signals TX1, TX2. The waveform generator 144 may directly generate an input signal TX1, wherein the phase difference between the input signal TX1 and the parent signal SIN is the optimum phase $\phi_2^{opt}$; on the other hand, the waveform generator 144 may also convert the optimum phase $\phi_2^{opt}$ into a delay time $\Delta t^{opt}$, and generate an input signal TX2, wherein the time difference between the input signal TX2 and the parent signal SIN is the delay time. These are also within the scope of the present disclosure.

Figure 12:
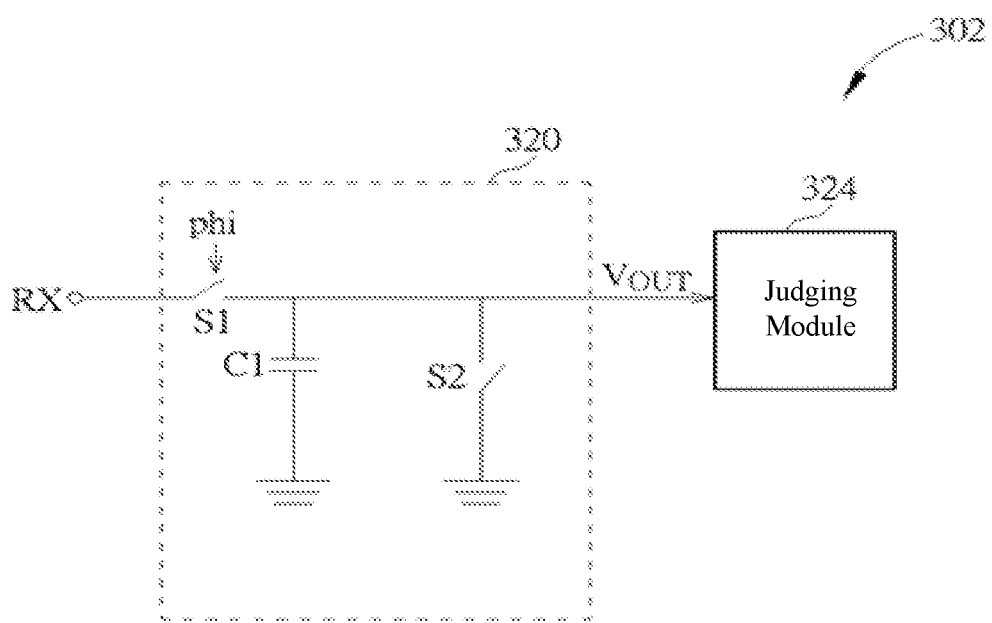
FIG. 12 is a schematic diagram of another capacitance judging circuit according to an embodiment of the present disclosure.

The phase calculation unit of the present embodiment may vary depending on the circuit configuration of the capacitance judging circuit. For example, corresponding to the capacitance judging circuit 202 including a mixer, the phase calculation units 242, 342, and 442 all include a mixer. However, the capacitance judging circuit is not limited to including a mixer, for example, please refer to FIG. 12, which is a schematic diagram of the capacitance judging circuit 302. The capacitor judging circuit 302 includes a charge transfer circuit 320 and a judging module 324. The charge transfer circuit 320 includes switches S1, S2 and a capacitor C1, the switch S1 having a first terminal for receiving the output signal RX and a second terminal coupled to a first terminal of the capacitor C1, the switch S2 having a first terminal coupled to the first terminal of the capacitor C1, a second terminal of the switch S2 and a second terminal of the capacitor C1 are coupled to ground. The switch S1 is controlled by a control signal phi, and the charge stored in the detection capacitor CUT can be transferred to the capacitor C1 by appropriately controlling the input signal TX and the control signal phi, and the switch S2 is configured to reset or empty the charge stored in the capacitor C1.

Figure 13:
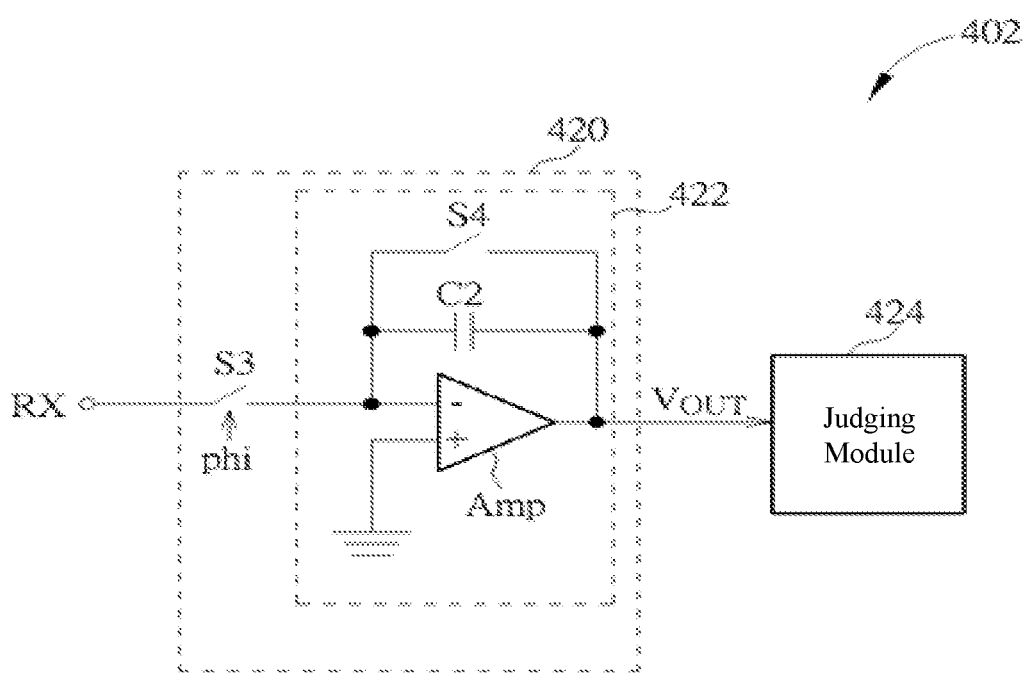
FIG. 13 is a schematic diagram of still another capacitance judging circuit according to an embodiment of the present disclosure.

Furthermore, please refer to FIG. 13, which is a schematic diagram of a capacitance judging circuit 402. The capacitor judging circuit 402 includes a charge transfer circuit 420 and a judging module 424. The charge transfer circuit 420 includes a switch S3, which is also controlled by the control signal phi, and an integrating circuit 422 which includes an amplifier Amp, a capacitor C2 and a switch S4, the capacitor C2 and the switch S4 are coupled between a negative input (labeled "−") of the amplifier Amp and an output of the amplifier Amp. The charge stored in the detection capacitor CUT can be transferred to the capacitor C2 by appropriately controlling the input signal TX and the control signal phi, and the switch S4 is configured to reset or empty the charge stored in the capacitor C1.

Figure 14:
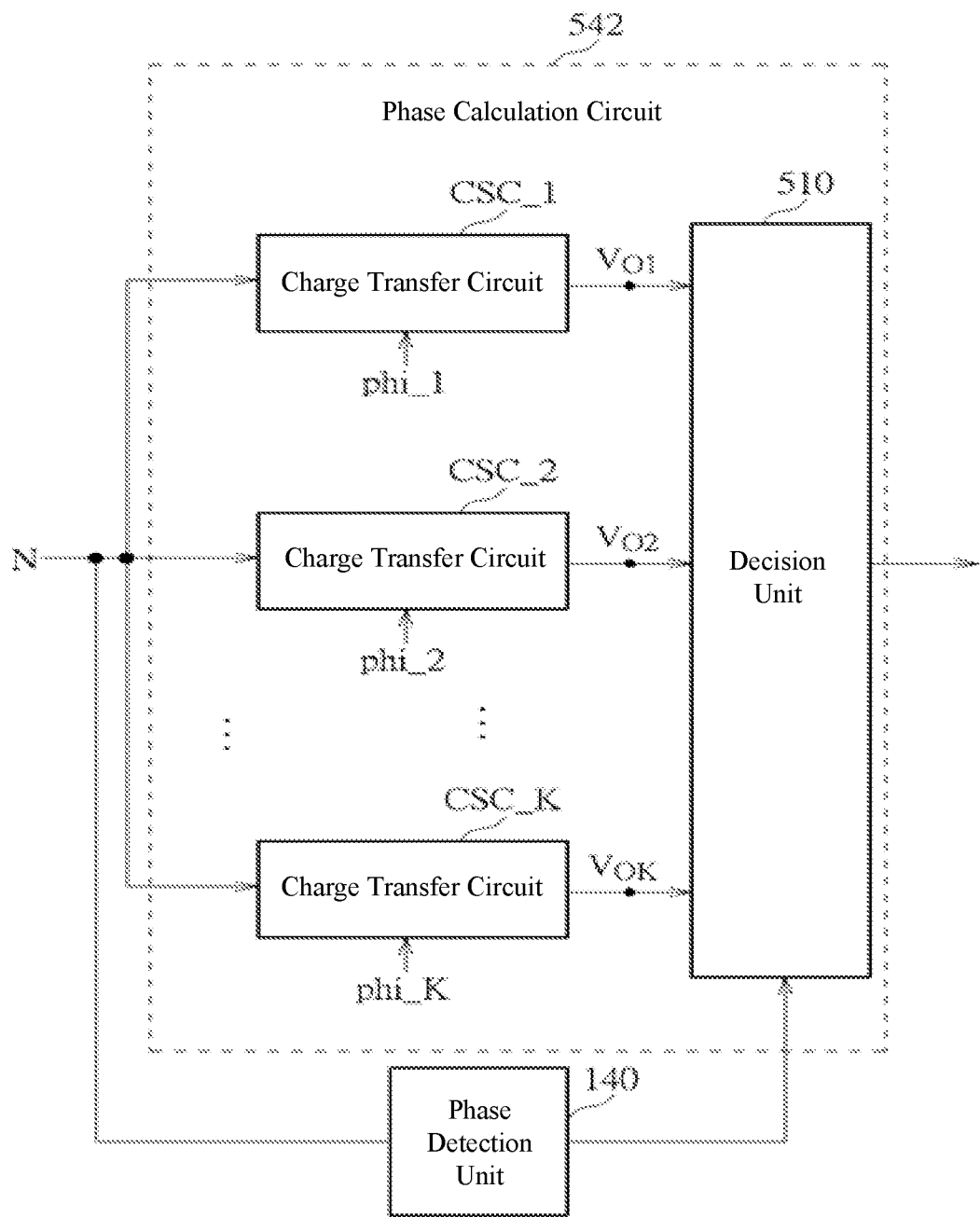
FIG. 14 is a schematic diagram of still another phase calculation unit according to an embodiment of the present disclosure.

Corresponding to the capacitance judging circuits 302 and 402 including a charge transfer circuit, the phase calculation unit according to the present embodiment may include at least one charge transfer circuit. For example, please refer to FIG. 14, which is a schematic diagram of a phase calculation unit 542 according to the present disclosure. The phase calculation unit 542 is similar in structure to the phase calculation unit 242, except that the phase calculation unit 542 replaces the mixers MX1~MXK and the integrators IG1~IGK of the phase calculation unit 242 with charge transfer circuits CSC_1~CSC_K. That is, the charge transfer circuits CSC_1~CSC_K generate signals VO1~VOK according to the noise N, and the decision unit 510 included in the phase calculation section 542 calculates the optimum phase $\phi_2^{opt}$ according to the signals VO1~VOK. Specifically, the charge transfer circuits CSC_1~CSC_K can be implemented by the circuit configuration of the charge transfer circuit 320 or the charge transfer circuit 420. The switches S1 or S3 (not shown in FIG. 14) of the charge transfer circuits CSC_1~CSC_K are respectively controlled by the control signals phi_1~phi_K, and the first terminal of the switch S1 or the switch S3 in CSC_1~CSC_K is used for receiving the noise N. The operation principle of the phase calculation unit 542 is similar to that of the phase calculation unit 242 and is therefore briefly described below. The control signals phi_1~phi_K have K different phases, respectively. For example, in an embodiment, the phase of the control signal phi_1 is 0, the phase of the control signal phi_2 is $\pi/K$, the phase of the control signal phi_3 is $2\pi/K$, and so on, the phase of the control signal phi_K is $(K-1)\pi/K$. The charge transfer circuits CSC_1~CSC_K receive the noise N and generate the signals VO1~VOK according to the control signals phi_1~phi_K, respectively. The decision unit 510 selects the signal VOS having the minimum energy from the signals VO1~VOK, wherein the control signal corresponding to the signal VOS is the control signal phi_S and the phase of the control signal phi_S is $(S-1)\pi/K$. Therefore, the phase calculation unit 542 can output the optimum phase $\phi_2^{opt}$ as $(S-1)\pi/K$.

Figure 15:
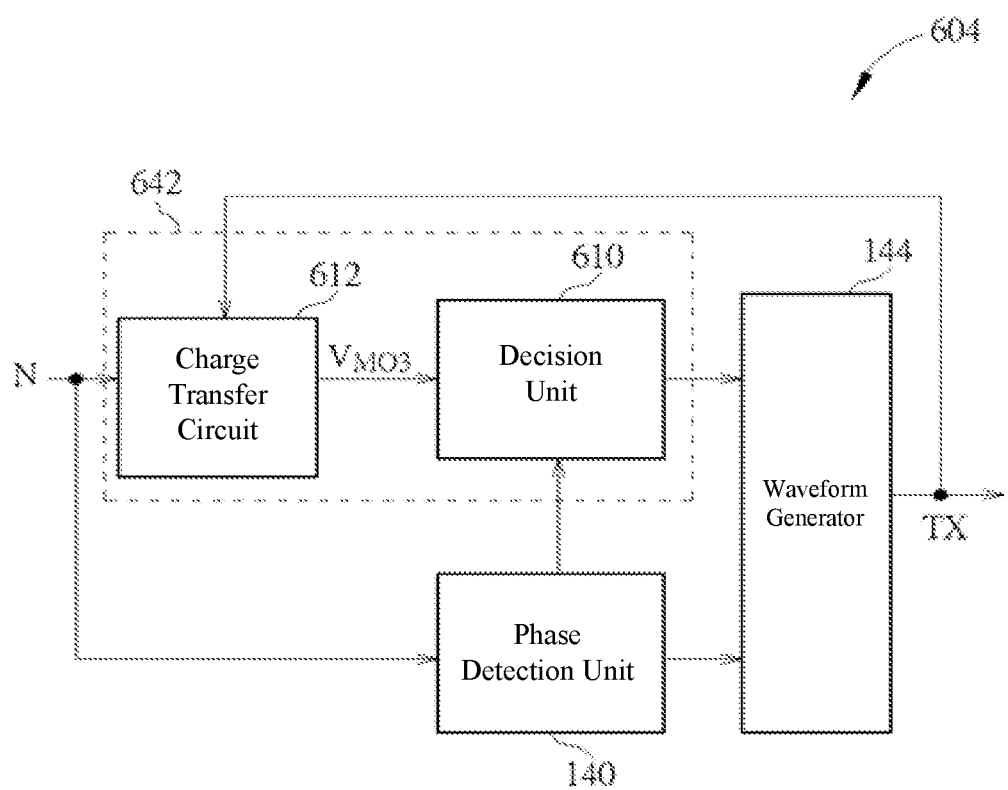
FIG. 15 is a schematic diagram of another input signal generator according to an embodiment of the present disclosure.

In addition, please refer to FIG. 15, which is a schematic diagram of an input signal generator 604 according to an embodiment of the present disclosure. The input signal generator 604 is similar in structure to the input signal generator 304 so that the same components adopt the same reference numerals. In contrast to the input signal generator 304, the input signal generator 604 includes a phase calculation unit 642 that includes a charge transfer circuit 612 and a decision unit 610. The charge transfer circuit 612 may be implemented by the circuit configuration of a charge transfer circuit 320 or the charge transfer circuit 420, wherein the switch S1 or the switch S3 (not shown in FIG. 15) of the charge transfer circuit 612 is controlled by the input signal TX generated by the waveform generator 144, and the first terminals of the switch S1 or the switch S3 in the charge transfer circuit 612 is configured to receive the noise N. That is, the input signal generator 604 replaces the mixer 312 of the input signal generator 304 with the charge transfer circuit 612, and the remaining operational principle is the same as that of the input signal generator 304, and will not be described here.

Figure 16:
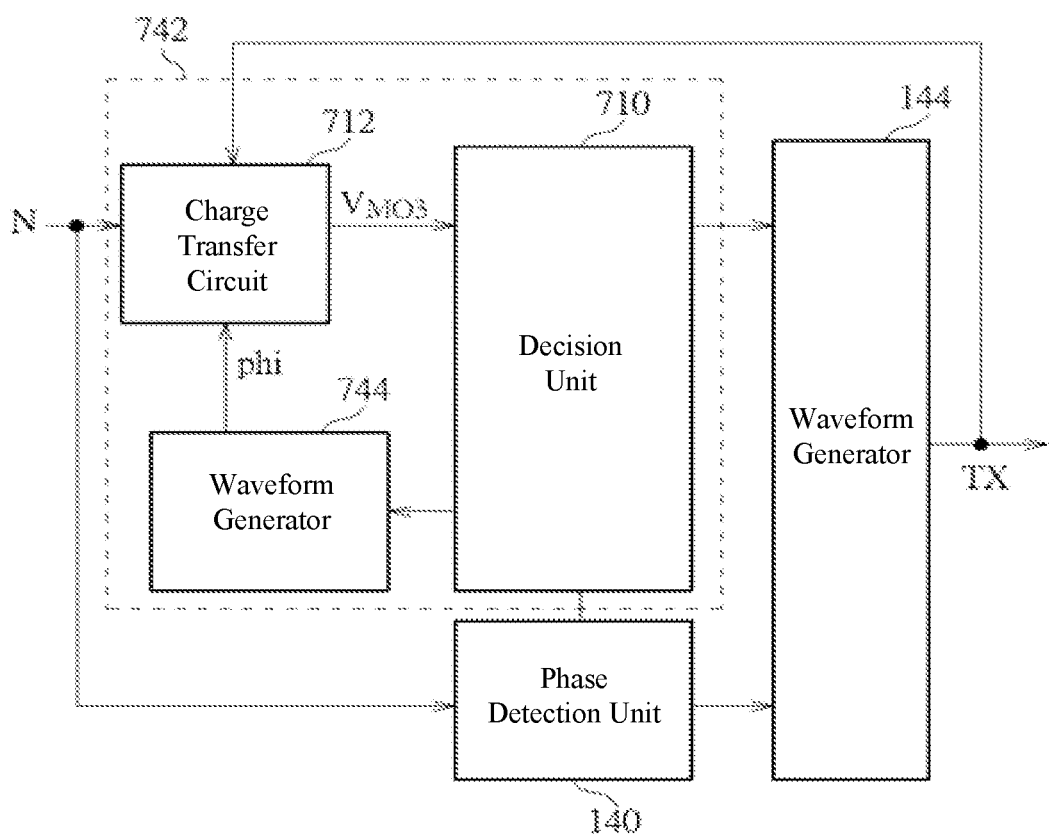
FIG. 16 is a schematic diagram of yet another phase calculation unit according to an embodiment of the present disclosure.

Furthermore, please refer to FIG. 16, which is a schematic diagram of the phase calculation unit 742 according to an embodiment of the present disclosure. The phase calculation unit 742 is similar in structure to the phase calculation unit 442, so the same components adopt the same reference numerals. Unlike the phase calculation unit 442, the phase calculation unit 742 includes a charge transfer circuit 712, a decision unit 710, and a waveform generator 744. The waveform generator 744 is configured to generate a control signal phi, the charge transfer circuit 712 can be implemented by a circuit configuration of the charge transfer circuit 320 or the charge transfer circuit 420, wherein, a switch S1 or a switch S3 (not shown in FIG. 16) of the charge transfer circuit 712 is controlled by the control signal phi generated by the waveform generator 744, the first terminal of the switch S1 or switch S3 of the charge transfer circuit 712 is configured to receive the noise N. That is, the phase calculation unit 742 replaces the mixer 412 of the phase calculation unit 442 with the charge transfer circuit 712, and replaces the local signal VLO of the phase calculation unit 442 with the control signal phi, and the remaining operation principle is the same as that of the phase calculation Unit 442, and will not be described here.

In summary, the capacitance sensing circuit of the present embodiment generates an input signal related to phase of a noise by using an input signal generator, to reduce the energy associated with the noise in the mixed output signal of the capacitance judging circuit, i.e. to reduce the influence of noise on judging the detection capacitor, so as to enhance the overall performance of the capacitance sensing circuit.

The above is only a partial preferred embodiment of the present disclosure and is not intended to be limiting of the present disclosure. Any modifications, equivalent substitutions and improvements within the spirit and principles of the present disclosure should be within the scope of the present disclosure.

What is claimed is:

1. A capacitance sensing circuit for sensing a detection capacitor of a detecting circuit, wherein, the detecting circuit receives an input signal and generates an output signal, the capacitance sensing circuit comprises:
   a capacitance judging circuit coupled to the detecting circuit and configured to judge a capacitance of the detection capacitor according to the output signal; and an input signal generator coupled to the detecting circuit and configured to generate the input signal according to noise, the input signal generator comprises:
  a phase detection unit configured to receive the noise and detect a first phase of the noise;
  a phase calculation unit coupled to the phase detection unit and configured to receive the noise and the first phase, and calculate an optimum phase according to the noise or the first phase; and
  a first waveform generator coupled to the phase calculation unit, and configured to generate the input signal according to the optimum phase-, wherein the first waveform generator converts the optimum phase into a delay time, and there is a time difference between the input signal and a parent signal, the time difference is the delay time.

2. The capacitance sensing circuit according to claim 1, wherein the phase detection unit comprises:
  a diode; and
  a capacitor comprising one terminal coupled to the diode and the other terminal coupled to ground.

3. The capacitance sensing circuit according to claim 1, wherein the phase detection unit comprises at least one comparator for comparing the noise with at least a threshold voltage.

4. The capacitance sensing circuit according to claim 1, wherein the phase calculation unit calculates the optimum phase as $$\phi_2^{opt} = \operatorname*{argmin}_{\phi_2}\left(\int n(t;\phi_1)x(t;\phi_2)dt\right)^2,$$

wherein, $n(t,\phi_1)$ represents a waveform of the noise when the phase of the noise is the first phase $\phi_1$, $x(t;\phi_2)$ represents a waveform of the input signal when the phase of the input signal is a second phase $\phi_2$.

5. The capacitance sensing circuit according to claim 1, wherein the phase calculation unit comprises a plurality of mixers that mix the noise with a plurality of local signals to generate a plurality of mixed output signals, wherein, the plurality of local signals have a plurality of phases; and
  the phase calculation unit calculates the optimum phase according to a plurality of mixed output signals.

6. The capacitance sensing circuit according to claim 1, wherein the phase calculation unit comprises a mixer, the mixer is coupled to the first waveform generator to generate a mixed output signal according to the input signal and the noise; and
  the phase calculation unit calculates the optimum phase according to the mixed output signal.

7. The capacitance sensing circuit according to claim 1, wherein the phase calculation unit comprises a mixer and a second waveform generator, the second waveform generator is configured to generate a local signal to the mixer according to a third phase, the mixer generates a mixed output signal according to the local signal and the noise; and
  the phase calculation unit calculates the optimum phase according to the mixed output signal of the mixer.

8. The capacitance sensing circuit according to claim 7, wherein the phase calculation unit further comprises a decision unit for generating the third phase.

9. The capacitance sensing circuit according to claim 1, wherein the first waveform generator is coupled to the phase calculation unit and the phase detection unit, and the first waveform generator is configured for generating the input signal according to at least one of the first phase and the optimum phase.

10. The capacitance sensing circuit according to claim 1, wherein the phase detection unit detects a first frequency of the noise, and the phase calculation unit calculates the optimum phase according to the first phase and the first frequency of the noise.

11. The capacitance sensing circuit according to claim 1, wherein the phase calculation unit comprises a plurality of charge transfer circuits, the plurality of charge transfer circuits are controlled by a plurality of control signals, the plurality of control signals have a plurality of phases, the plurality of charge transfer circuits generate a plurality of charge output signals according to the noise; and
  the phase calculation unit calculates the optimum phase according to the plurality of charge output signals.

12. The capacitance sensing circuit according to claim 11, wherein the charge transfer circuit comprises:
  a first switch; and
  a first capacitor coupled to the first switch.

13. The capacitance sensing circuit according to claim 12, wherein the first capacitor is coupled to ground.

14. The capacitance sensing circuit according to claim 12, wherein the charge transfer circuit further comprises an amplifier, the first capacitor is coupled between a first input and an output of the amplifier.

15. The capacitance sensing circuit according to claim 1, wherein the phase calculation unit comprises a charge transfer circuit, the charge transfer circuit comprises:
  a second switch; and
  a second capacitor coupled to the second switch and the ground.

16. The capacitance sensing circuit according to claim 15, wherein the charge transfer circuit further comprises an amplifier, and the second capacitor is coupled between a first input and an output of the amplifier.

17. The capacitance sensing circuit according to claim 15, wherein the charge transfer circuit is coupled to the first waveform generator, the second switch of the charge transfer circuit is controlled by the input signal, and the charge transfer circuit generates a charge output signal according to the input signal and the noise; and
  the phase calculation unit calculates the optimum phase according to the charge output signal.

18. The capacitance sensing circuit according to claim 15, wherein the phase calculation unit further comprises a third waveform generator configured to generate a control signal to the charge transfer circuit according to a fourth phase, wherein, the second switch of the charge transfer circuit is controlled by the control signal, the charge transfer circuit generates a charge output signal according to the control signal and the noise; and
  the phase calculation unit calculates the optimum phase according to the charge output signal.

19. The capacitance sensing circuit according to claim 1, wherein there is a phase difference between the input signal and a parent signal, and the phase difference is the optimum phase, wherein the first waveform generator directly generates the input signal according to the parent signal.

* * * * *